United States Patent
Kim

(10) Patent No.: US 10,886,237 B2
(45) Date of Patent: Jan. 5, 2021

(54) SEMICONDUCTOR DEVICE

(71) Applicant: Samsung Electronics Co., Ltd., Suwon-si (KR)

(72) Inventor: Myoung Soo Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/518,274

(22) Filed: Jul. 22, 2019

(65) Prior Publication Data
US 2020/0258848 A1    Aug. 13, 2020

(30) Foreign Application Priority Data
Feb. 7, 2019  (KR) .................. 10-2019-0014298

(51) Int. Cl.
| H01L 23/522 | (2006.01) |
| H01L 23/00 | (2006.01) |
| H01L 29/06 | (2006.01) |
| H01L 29/423 | (2006.01) |
| H01L 23/528 | (2006.01) |

(52) U.S. Cl.
CPC .......... *H01L 23/562* (2013.01); *H01L 23/528* (2013.01); *H01L 23/5222* (2013.01); *H01L 29/0607* (2013.01); *H01L 29/42316* (2013.01)

(58) Field of Classification Search
CPC .......................... H01L 23/5222; H01L 23/528
See application file for complete search history.

(56) References Cited

U.S. PATENT DOCUMENTS

| 7,646,078 B2 | 1/2010 | Jeng et al. |
| 8,492,873 B1 | 7/2013 | Tan |
| 8,587,023 B2 | 11/2013 | Lee |
| 9,620,460 B2 | 4/2017 | Noh et al. |
| 9,847,301 B2 | 12/2017 | Minami et al. |
| 2009/0020811 A1* | 1/2009 | Voldman ........... H01L 29/66659 257/337 |

FOREIGN PATENT DOCUMENTS

| KR | 10-2006-0025462 A | 3/2006 |
| KR | 10-2009-0107816 A | 10/2009 |
| KR | 10-0933808 B1 | 12/2009 |
| KR | 10-2011-0002335 A | 1/2011 |
| KR | 10-2012-0097981 A | 9/2012 |

* cited by examiner

*Primary Examiner* — Thomas L Dickey
(74) *Attorney, Agent, or Firm* — Harness, Dickey & Pierce, P.L.C.

(57) ABSTRACT

The semiconductor device including a substrate comprising a chip region and a guard-ring region which surrounds a side surface of the chip region, an isolation layer configured to define an active region within the guard-ring region, a first doping layer in the active region and doped with first impurities having a first doping concentration, a second doping layer on the first doping layer and in the active region, the second doping layer doped with second impurities having a same conductivity type as the first impurities of the first doping layer, the second impurities having a second doping concentration, the second doping concentration being greater than the first doping concentration, a first gate electrode on the second doping layer, and a first wire layer on the first gate electrode may be provided.

20 Claims, 13 Drawing Sheets

SEMICONDUCTOR DEVICE

CROSS-REFERENCE TO RELATED APPLICATION

This application claims priority to Korean Patent Application No. 10-2019-0014298, filed on Feb. 7, 2019, in the Korean Intellectual Property Office, and all the benefits accruing therefrom under 35 U.S.C. § 119, the disclosure of which is incorporated herein by reference in its entirety.

BACKGROUND

Technical field

The present disclosure relates to semiconductor devices.

Description of the Related Art

Fabricating semiconductor devices on a wafer requires high accuracy in general, and a variety of quality assessment is performed because a wafer need to be immediately selected when the wafer is out of proper conditions or has low yield during performance of fabrication. A wafer including semiconductor devices are manufactured after having been evaluated through various test processes, and separated into individual semiconductor devices by sawing the wafer along a scribe line for actual selling.

However, a scribe line region may be inflicted with physical damage or crack during the sawing fabrication. Such a crack or damage may be transferred to a semiconductor element region across the scribe line where sawing is performed, and also may cause permanent damage to the semiconductor element as the water in the air is introduced and diffused through the crack.

SUMMARY

The inventive concepts of the present disclosure provide a semiconductor device which can efficiently protect a semiconductor chip from physical damage, electro-magnetic interference (EMI), and electro static discharge (ESD) and so on by disposing a MOS capacitor including a plurality of doping layers that have a same conductivity type in a guard-ring region, and have different doping concentrations from each other.

According to an example embodiment of the present disclosure, a semiconductor device may include a substrate comprising a chip region and a guard-ring region, the guard-ring region surrounding a side surface of the chip region, an isolation layer configured to define an active region within the guard-ring region, a first doping layer in the active region and doped with first impurities having a first doping concentration, a second doping layer on the first doping layer and in the active region, the second doping layer doped with second impurities having a same conductivity type as the first impurities of the first doping layer, the second impurities having a second doping concentration, the second doping concentration being greater than the first doping concentration, a first gate electrode on the second doping layer, and a first wire layer on the first gate electrode.

According to an example embodiment of the present disclosure, a semiconductor device may include a substrate comprising a chip region and a guard-ring region, the guard-ring region surrounding a side surface of the chip region, a first doping layer within the guard-ring region and doped with first impurities having a first doping concentration, a second doping layer on the first doping layer and within the guard-ring region, the second doping layer doped with second impurities having a same conductivity type as the first impurities of the first doping layer, the second impurities having a second doping concentration, the second doping concentration being greater than the first doping concentration, a first gate electrode on the second doping layer, a first wire layer on the first gate electrode, and a second wire layer on the guard-ring region at a same level as the first wire layer, and spaced apart from the first wire layer.

According to an example embodiment of the present disclosure, a semiconductor device may include a substrate comprising a chip region and a guard-ring region, the guard-ring region surrounding a side surface of the chip region, an isolation layer configured to define an active region within the guard-ring region, a first doping layer in the active region, and doped with first impurities having a first doping concentration, a second doping layer on the first doping layer and in the active region, the second doping layer being in contact with the isolation layer, the second doping layer doped with second impurities having a same conductivity type as the first impurities of the first doping layer, the second impurities having a second doping concentration, the second doping concentration being greater than the first doping concentration, and a first gate electrode on the second doping layer, the first gate electrode having a unified shape surrounding the side surface of the chip region.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Hereinbelow, semiconductor devices according to some example embodiments will be described with reference to FIG. 1 to FIG. 6.

Figure 1:
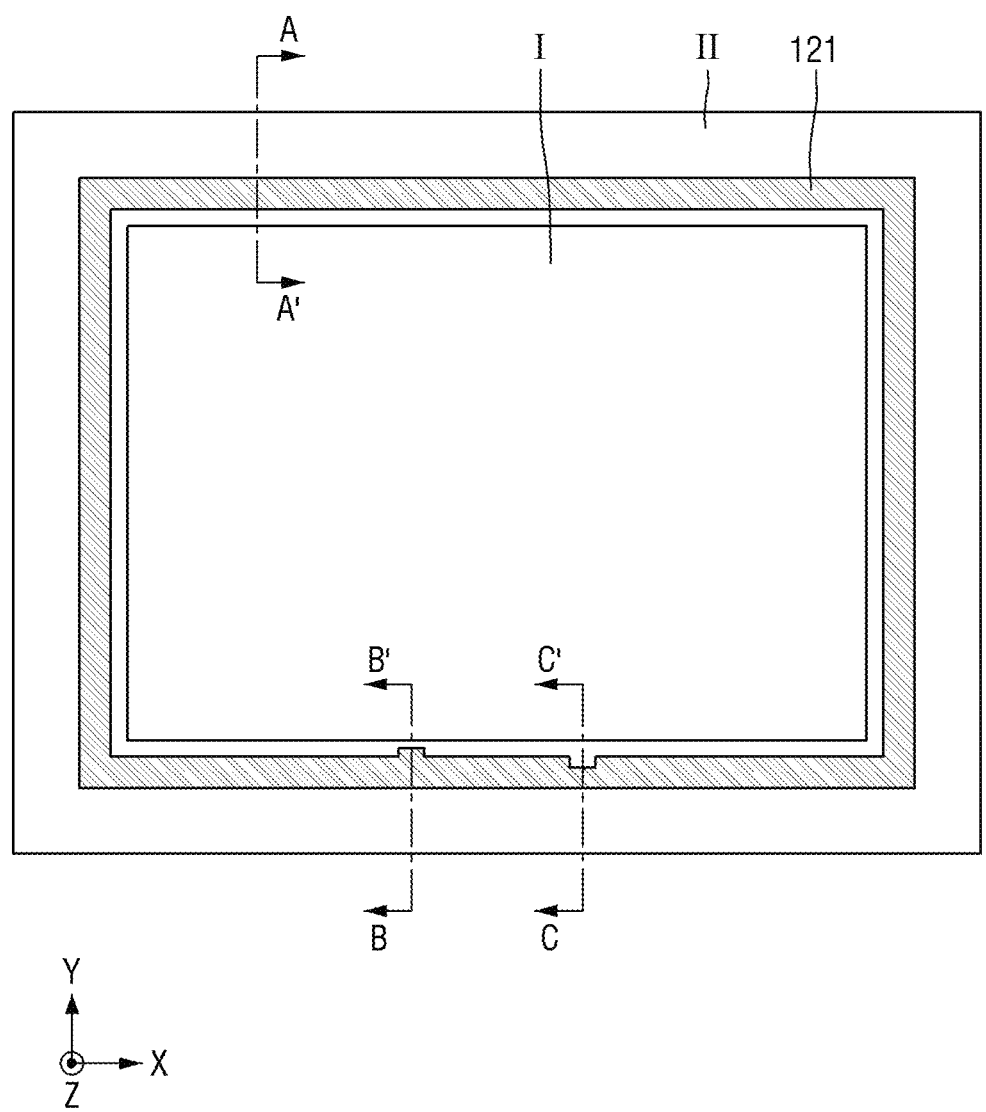
FIG. 1 is a schematic layout view of a level in which a gate electrode is disposed in a semiconductor device according to an example embodiment.
Figure 2:
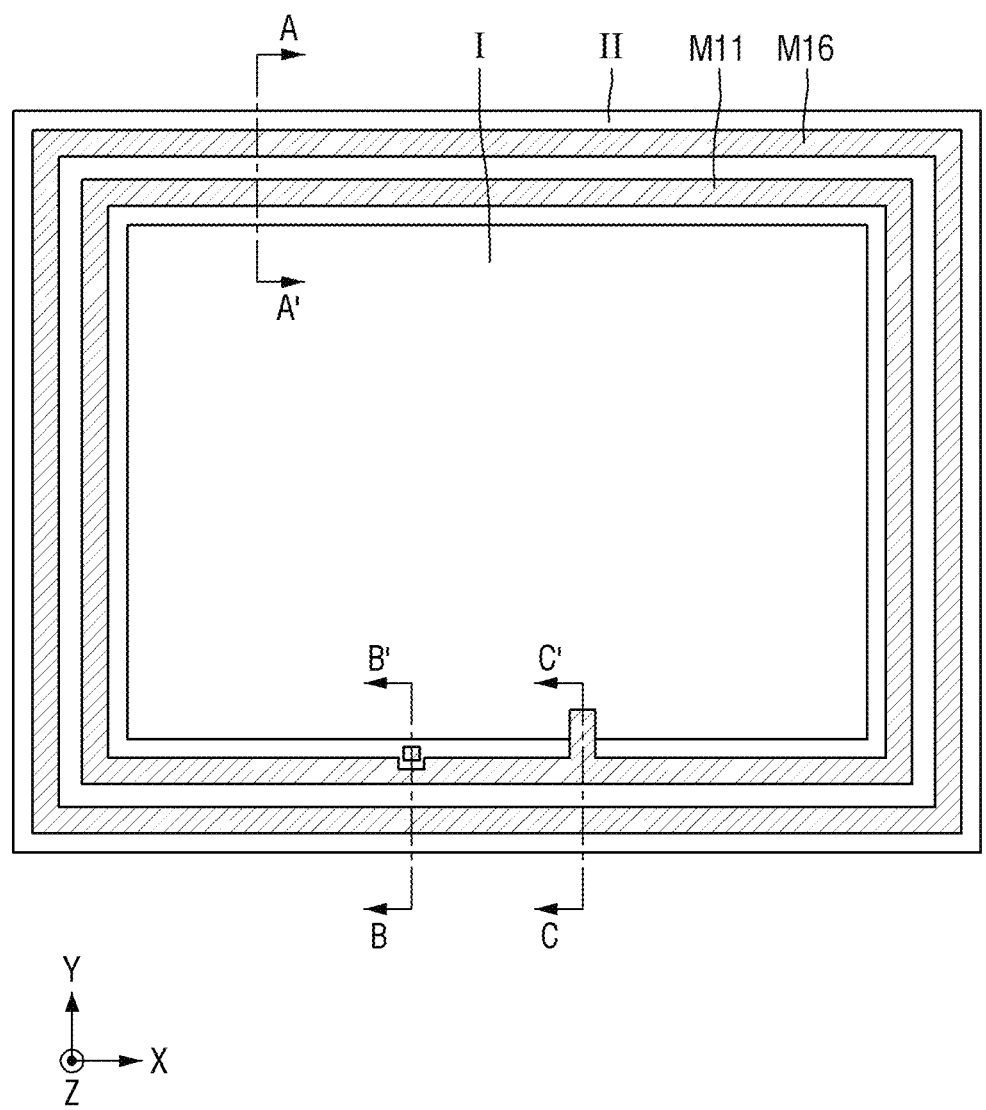
FIG. 2 is a schematic layout view of a level in which a first wire layer is disposed in a semiconductor device according to an example embodiment.
Figure 3:
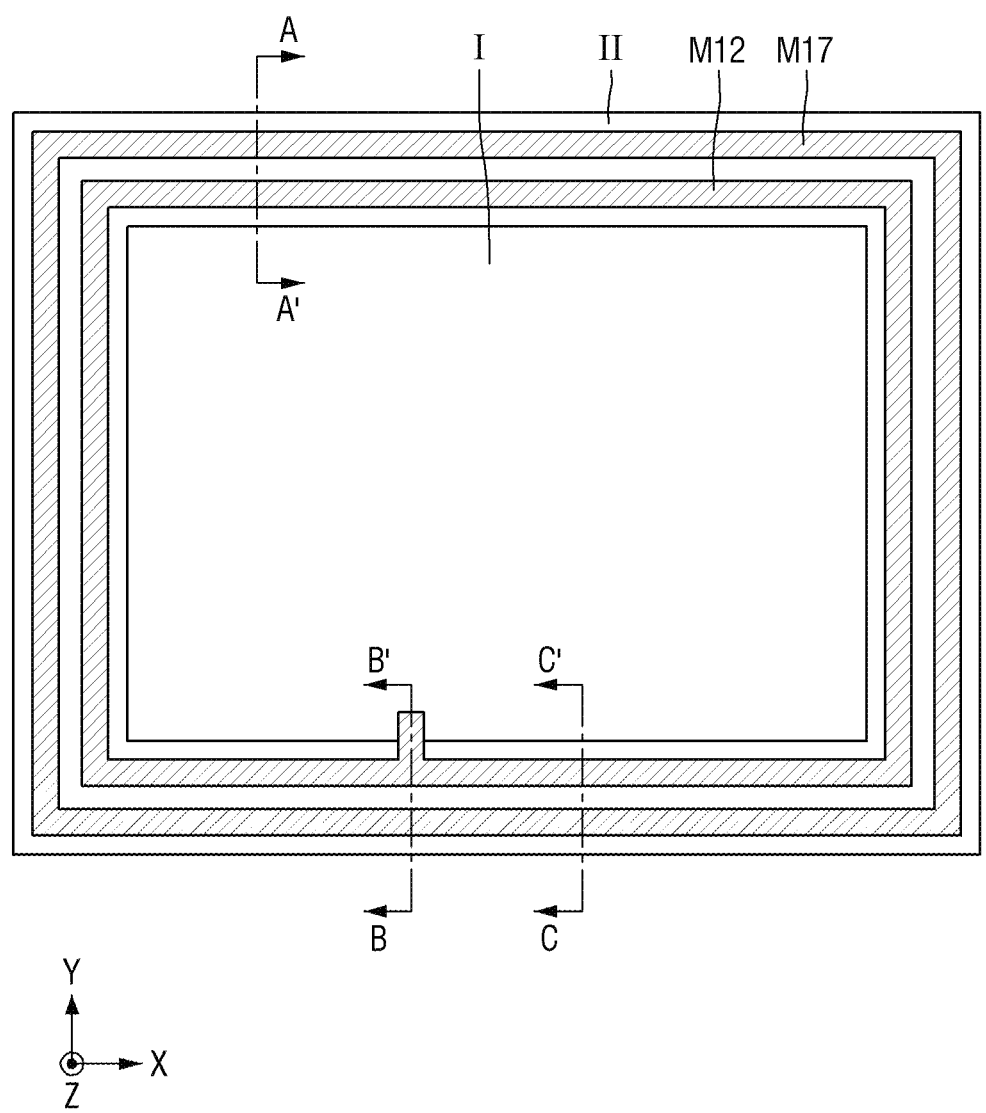
FIG. 3 is a schematic layout view of a level in which a second wire layer is disposed in a semiconductor device according to an example embodiment.
Figure 4:
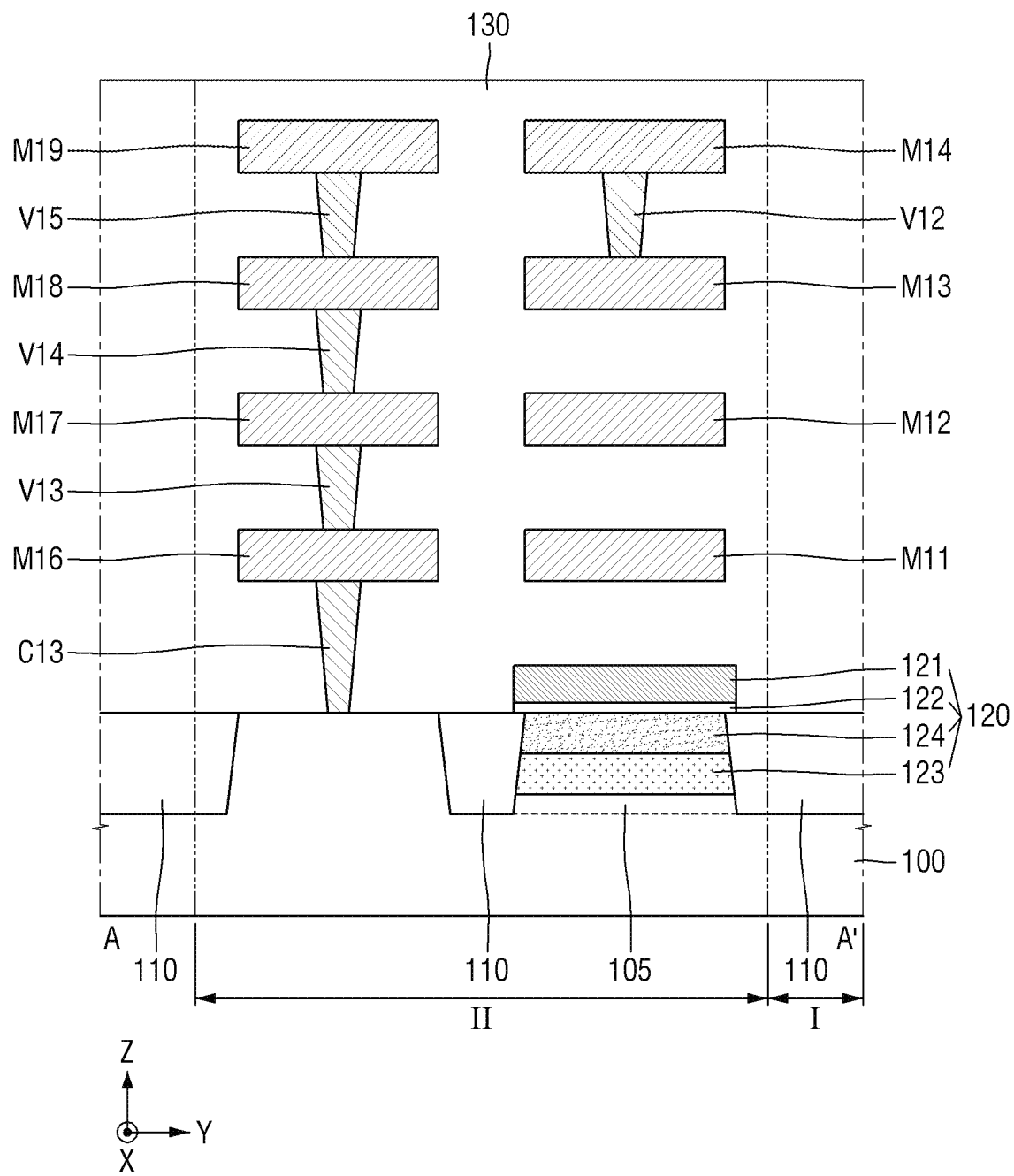
FIG. 4 is a cross-sectional view taken on line A-A' of FIG. 1 to FIG. 3.
Figure 5:
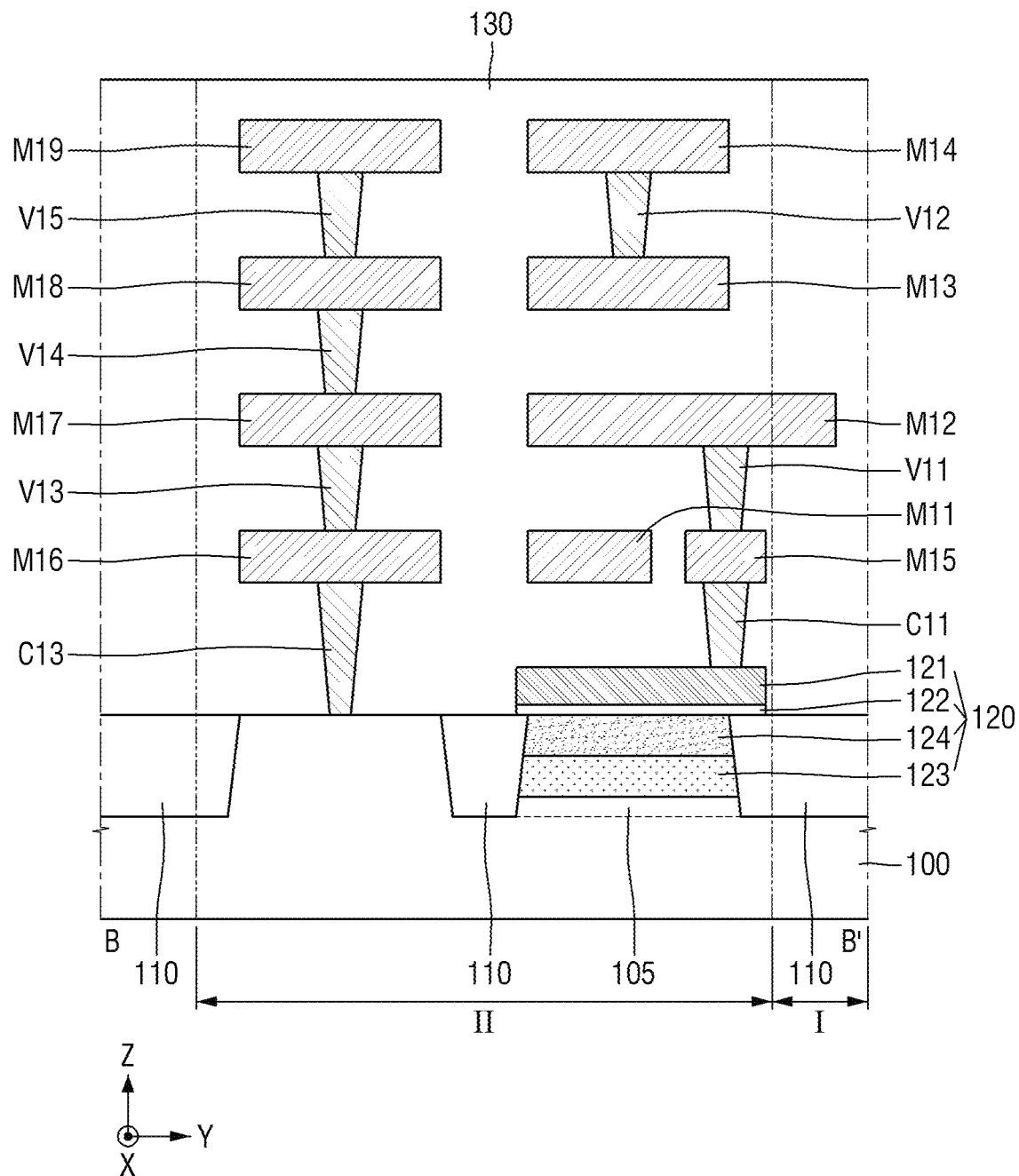
FIG. 5 is a cross-sectional view taken on line B-B' of FIG. 1 to FIG. 3.
Figure 6:
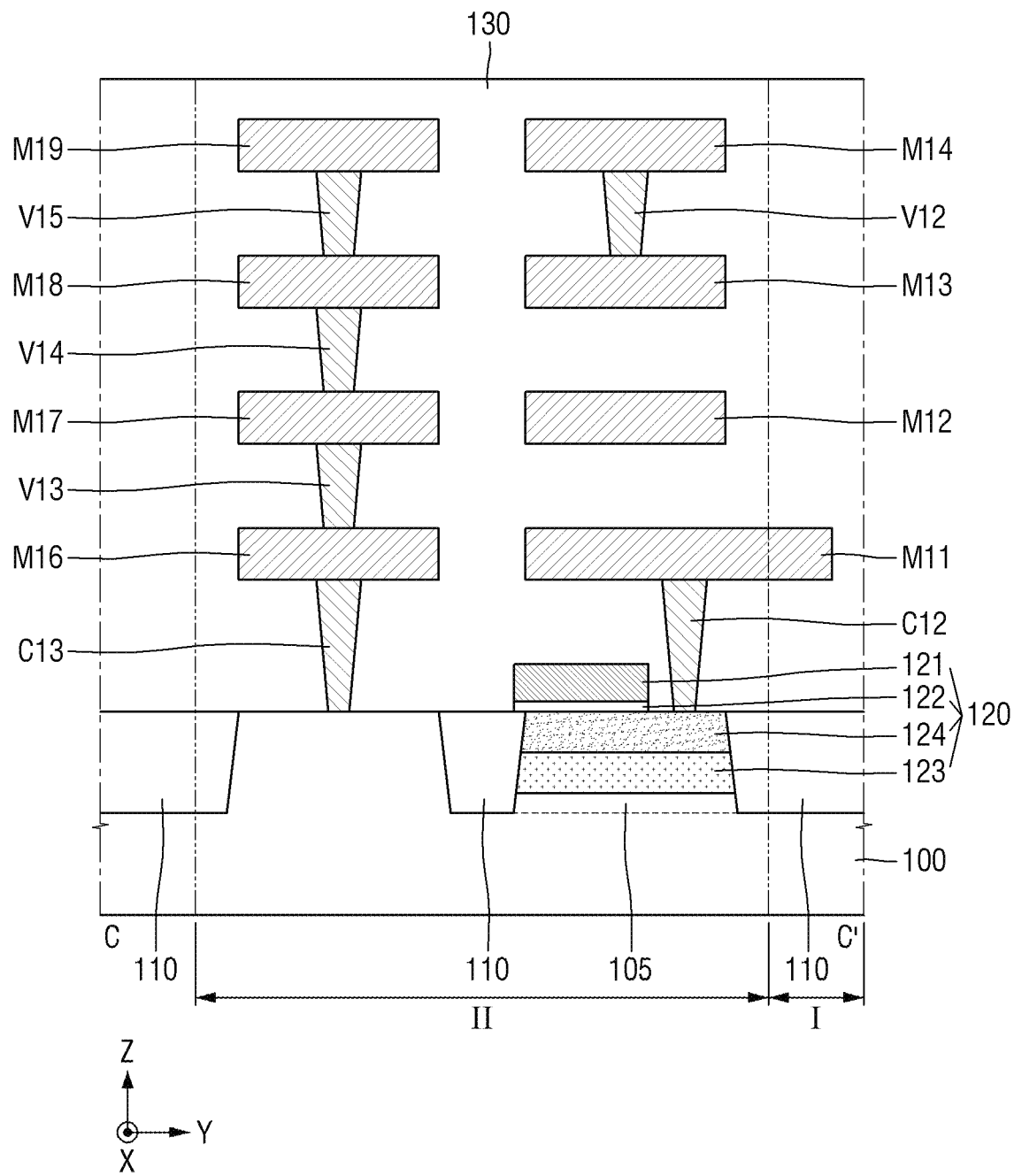
FIG. 6 is a cross-sectional view taken on line C-C' of FIG. 1 to FIG. 3.

FIG. 1 is a schematic layout view of a level in which a gate electrode is disposed in a semiconductor device according to an example embodiment. FIG. 2 is a schematic layout view of a level in which a first wire layer is disposed in a semiconductor device according to an example embodiment. FIG. 3 is a schematic layout view of a level in which a second wire layer is disposed in a semiconductor device according to an example embodiment. FIG. 4 is a cross-sectional view taken on line A-A' of FIG. 1 to FIG. 3. FIG. 5 is a cross-sectional view taken on line B-B' of FIG. 1 to FIG. 3. FIG. 6 is a cross-sectional view taken on line C-C' of FIG. 1 to FIG. 3.

Referring to FIG. 1 to FIG. 6, the semiconductor device according to some example embodiments includes a substrate 100, an active region 105, an isolation layer 110, a first capacitor 120, first to ninth wire layers M11 to M19, first to third contacts C11 to C13, first to fifth vias V11 to V15, and an interlayer insulating film 130.

The substrate 100 may be bulk silicon or a silicon-on-insulator (SOI). Alternatively, the substrate 100 may be a silicon substrate, or may include other materials such as silicon germanium, silicon germanium on insulator (SGOI), indium antimonide, lead telluride compound, indium arsenide, indium phosphide, gallium arsenide, or gallium antimonide, but not limited hereto. The substrate 100 may be named as, for example, a semiconductor wafer.

The substrate 100 may include a chip region I and a guard-ring region II. Although it is illustrated in FIG. 1 to FIG. 3 that one chip region I and one guard-ring region II are formed, this is only for convenience of explanation; a number of the chip region I and the guard-ring region II formed on the substrate 100 is not limited.

A semiconductor chip may be disposed on the chip region I. For example, a semiconductor element such as memory element or logic element may be formed on the chip region I. Further, the semiconductor element may include a various types of individual elements. For example, the individual elements may include MOSFET (e.g., CMOS transistor), system large scale integration (LSI), an image sensor (e.g., CMOST image sensor (CIS)), microelectromechanical systems, other various active elements and/or passive elements.

The guard-ring region II may surround a side surface of the chip region I. The guard-ring region II may completely surround a side surface of the chip region I. However, the present disclosure is not limited hereto. That is, according to some other example embodiments, the guard-ring region II may surround only a portion of a side surface of the chip region I.

The guard-ring region II may be on a scribe line region where the substrate 100 (e.g., wafer) is cut.

The guard-ring region II may function to block physical crack that may occur in sawing fabrication from being transferred or water from being diffused through the crack. Further, the guard-ring region II may function to receive introduction and discharge externally again when various abnormal electro-magnetic interference (EMI), electro static discharge (ESD), and so on occur in an external portion of the semiconductor chip and are introduced.

The isolation layer 110 may be within the guard-ring region II of the substrate 100 and define the active region 105 within the guard-ring region II.

The isolation layer 110 may have a shallow trench isolation (STI) structure having sturdy element isolation characteristics. The isolation layer 110 may include, for example, at least one of silicon oxide (SiO2), silicon nitride (SiN), silicon carbide (SiC), silicon oxycarbide (SiOC), silicon oxynitride (SiON), and silicon oxycarbon nitride (SiOCN).

Although it is illustrated in FIG. 4 to FIG. 6 that the isolation layer 110 is formed as a single film, this is only for convenience of explanation, and thus the present disclosure is not limited hereto.

The first capacitor 120 may be in the guard-ring region II. For example, the first capacitor 120 may be on the active region 105 of the guard-ring region II and the active region 105 of the guard-ring region II. The first capacitor 120 may be a boron nitride (BN) capacitor, for example.

The first capacitor 120 may include a first gate electrode 121, a first gate insulating film 122, a first doping layer 123, and a second doping layer 124.

The first doping layer 123 may be within the active region 105 of the guard-ring region II. The first doping layer 123 may be doped with first impurities having a first conductivity type (e.g., n-type impurity) and a first doping concentration. However, the present disclosure is not limited hereto.

A side surface of the first doping layer 123 may be in contact with the isolation layer 110. A lower surface of the first doping layer 123 may be closer to the first gate electrode 121 than to a lower surface of the isolation layer 110.

The second doping layer 124 may be on the first doping layer 123 within the active region 105 of the guard-ring region II. The second doping layer 124 may be doped with second impurities having a second doping concentration, which is greater than the first doping concentration. The second impurities of the second doping layer 124 may have a same conductivity type (e.g., n-type impurity) as the first impurities of the first doping layer 123.

A side surface of the second doping layer 124 may be in contact with the isolation layer 110. A lower surface of the second doping layer 124 may be closer to the first gate electrode 121 than to a lower surface of the isolation layer 110. An upper surface of the second doping layer 124 may be on a same plane as an upper surface of the isolation layer 110.

The first gate insulating film 122 may be on the second doping layer 124. For example, the first gate insulating film 122 may be conformally disposed on a portion of an upper surface of the second doping layer 124 and a portion of an upper surface of the isolation layer 110 within the guard-ring region II. However, the present disclosure is not limited hereto. That is, according to some other example embodiments, the first gate insulating film 122 may not be on an upper surface of the isolation layer 110.

The first gate insulating film 122 may include silicon oxide, silicon nitride, silicon oxynitride or a high-k dielectric material with a higher dielectric constant than silicon oxide. For example, the high-k dielectric material may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The high-k dielectric material described above is explained mainly with reference to oxide. However, the present disclosure is not limited hereto. In some example embodiments, the high-k dielectric material may include one or more of the nitride (e.g., hafnium nitride) or the oxynitride (e.g., hafnium oxynitride) of the metallic materials (e.g., hafnium).

The first gate electrode 121 may be on the first gate insulating film 122. The first gate electrode 121 may surround a side surface of the chip region I within the guard-ring region II. For example, the first gate electrode 121 may completely or partially surround a side surface of the chip region I as extending in a first direction X and a second direction Y. The first gate electrode 121 may have a unified or integral shape, as illustrated in FIG. 1. However, the present disclosure is not limited hereto. According to some example embodiments, the unified or integral shape of the first gate electrode 121 may be a circle or a polygon. According to some example embodiments, the unified or integral shape of the first gate electrode 121 may be a geometrical figure that is not fully closed. According to some other example embodiments, the first gate electrode 121 may be a geometrical figure that is defined by a series of discrete structures.

As illustrated in FIG. 1 and FIG. 5, for example, a portion of the first gate electrode 121 may protrude over an isolation layer 110 at a boundary between the guard-ring region II and the chip region I in a direction from the guard-ring region II to the chip region I. However, the present disclosure is not limited hereto.

As illustrated in FIG. 1 and FIG. 6, for example, a portion of the first gate electrode 121 may be indented in a direction from the chip region Ito the guard-ring region II. However, the present disclosure is not limited hereto.

The first gate electrode 121 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

The first gate electrode 121 may include, for example, conductive metal oxide, conductive metal oxynitride and so on, or an oxidized form of the metallic materials from the aforementioned materials.

The first to ninth wire layers M11 to M19 may be on the substrate 100 of the guard-ring region II.

Each of the first to ninth wire layers M11 to M19 may include, for example, at least one of metal (e.g., copper, tungsten, nickel, cobalt, or tantalum), metal silicide (e.g., tungsten silicide, nickel silicide, cobalt silicide, or tantalum silicide), polysilicon doped with impurity, or a combination thereof. But the present disclosure is not limited hereto.

The first wire layer M11 may be on the first gate electrode 121 within the guard-ring region II. At least a portion of the first wire layer M11 may overlap the first gate electrode 121 in a third direction Z. The first wire layer M11 may completely or partially surround a side surface of the chip region I as extending in the first direction X and the second direction Y. The first wire layer M11 may have a unified or integral shape, as illustrated in FIG. 2. However, the present disclosure is not limited hereto. According to some example embodiments, the unified or integral shape of the first wire layer M11 may be a circle or a polygon. According to some example embodiments, the unified or integral shape of the first wire layer M11 may be a geometrical figure that is not fully closed. According to some other example embodiments, the first wire layer M11 may be a geometrical figure that is defined by a series of discrete structures.

As illustrated in FIG. 2 and FIG. 5, for example, a portion of the first wire layer M11 may be indented in a direction from the chip region I to the guard-ring region. However, the present disclosure is not limited hereto.

As illustrated in FIG. 2 and FIG. 6, for example, a portion of the first wire layer M11 may extend in an internal portion of the chip region I. However, the present disclosure is not limited hereto.

The second wire layer M12 may be on the first wire layer M11 within the guard-ring region II. At least a portion of the second wire layer M12 may overlap the first wire layer M11 in the third direction Z. The second wire layer M12 may completely or partially surround a side surface of the chip region I as extending in the first direction X and the second direction Y. The second wire layer M12 may have a unified or integral shape, as illustrated in FIG. 3. However, the present disclosure is not limited hereto. According to some example embodiments, the unified or integral shape of the second wire layer M12 may be a circle or a polygon. According to some example embodiments, the unified or integral shape of the second wire layer M12 may be a geometrical figure that is not fully closed. According to some other example embodiments, the second wire layer M12 may be a geometrical figure that is defined by a series of discrete structures.

As illustrated in FIG. 3 and FIG. 5, for example, a portion of the second wire layer M12 may extend into the chip region I from the guard-ring region II. However, the present disclosure is not limited hereto.

The third wire layer M13 may be on the second wire layer M12 within the guard-ring region II. At least a portion of the third wire layer M13 may overlap the second wire layer M12 in the third direction Z. The third wire layer M13 may completely or partially surround a side surface of the chip region I as extending in the first direction X and the second direction Y. The third wire layer M13 may have a unified or integral shape. However, the present disclosure is not limited hereto. According to some example embodiments, the unified or integral shape of the second wire layer M12 may be a circle or a polygon. According to some example embodiments, the unified or integral shape of the second wire layer M12 may be a geometrical figure that is not fully closed. According to some other example embodiments, the second wire layer M12 may be a geometrical figure that is defined by a series of discrete structures.

The fourth wire layer M14 may be on the third wire layer M13 within the guard-ring region II. At least a portion of the fourth wire layer M14 may overlap the third wire layer M13 in the third direction Z. The fourth wire layer M14 may completely or partially surround a side surface of the chip region I as extending in the first direction X and the second direction Y. The fourth wire layer M14 may have a unified or integral shape. However, the present disclosure is not limited hereto. According to some example embodiments, the unified or integral shape of the fourth wire layer M14 may be a circle or a polygon. According to some example embodiments, the unified or integral shape of the fourth wire layer M14 may be a geometrical figure that is not fully closed. According to some other example embodiments, the fourth wire layer M14 may be a geometrical figure that is defined by a series of discrete structures.

The fifth wire layer M15 may be on the first gate electrode 121 within the guard-ring region II. The fifth wire layer M15 may be at a same level as the first wire layer M11. Herein, the term, "same level," refers to being formed by a same fabricating process.

The fifth wire layer M15 may be spaced apart from the first wire layer M11. The fifth wire layer M15 may be between the first wire layer M11 and the chip region I so that the first wire layer M11 is indented or shrunk in a direction from the chip region I to the guard-ring region II, in the guard-ring region II.

The sixth wire layer M16 may be on the substrate 100 within the guard-ring region II. The sixth wire layer M16 may completely or partially surround a side surface of the chip region I as extending in the first direction X and the second direction Y. The sixth wire layer M16 may have a unified or integral shape, as illustrated in FIG. 2. However, the present disclosure is not limited hereto. According to some example embodiments, the unified or integral shape of the sixth wire layer M16 may be a circle or a polygon. According to some example embodiments, the unified or integral shape of the sixth wire layer M16 may be a geometrical figure that is not fully closed. According to some other example embodiments, the sixth wire layer M16 may be a geometrical figure that is defined by a series of discrete structures.

The sixth wire layer M16 may be at a same level as the first wire layer M11. The sixth wire layer M16 may be spaced apart from the first wire layer M11. The first wire layer M11 may be between the sixth wire layer M16 and the chip region I.

The seventh wire layer M17 may be on the sixth wire layer M16 within the guard-ring region II. The seventh wire layer M17 may completely or partially surround a side surface of the chip region I as extending in the first direction X and the second direction Y. The seventh wire layer M17 may have a unified or integral shape, as illustrated in FIG. 3. However, the present disclosure is not limited hereto. According to some example embodiments, the unified or integral shape of the seventh wire layer M17 may be a circle or a polygon. According to some example embodiments, the unified or integral shape of the seventh wire layer M17 may be a geometrical figure that is not fully closed. According to some other example embodiments, the seventh wire layer M17 may be a geometrical figure that is defined by a series of discrete structures.

The seventh wire layer M17 may be at a same level as the second wire layer M12. The seventh wire layer M17 may be spaced apart from the second wire layer M12. The second wire layer M12 may be between the seventh wire layer M17 and the chip region I.

The eighth wire layer M18 may be on the seventh wire layer M17 within the guard-ring region II. The eighth wire layer M18 may completely or partially surround a side surface of the chip region I as extending in the first direction X and the second direction Y. The eighth wire layer M18 may have a unified or integral shape. However, the present disclosure is not limited hereto. According to some example embodiments, the unified or integral shape of the eighth wire layer M18 may be a circle or a polygon. According to some example embodiments, the unified or integral shape of the eighth wire layer M18 may be a geometrical figure that is not fully closed. According to some other example embodiments, the eighth wire layer M18 may be a geometrical figure that is defined by a series of discrete structures.

The eighth wire layer M18 may be at a same level as the third wire layer M13. The eighth wire layer M18 may be spaced apart from the third wire layer M13. The third wire layer M13 may be between the eighth wire layer M18 and the chip region I.

The ninth wire layer M19 may be on the eighth wire layer M18 within the guard-ring region II. The ninth wire layer M19 may completely or partially surround a side surface of the chip region I as extending in the first direction X and the second direction Y. The ninth wire layer M19 may have a unified or integral shape. However, the present disclosure is not limited hereto. According to some example embodiments, the unified or integral shape of the ninth wire layer M19 may be a circle or a polygon. According to some example embodiments, the unified or integral shape of the ninth wire layer M19 may be a geometrical figure that is not fully closed. According to some other example embodiments, the ninth wire layer M19 may be a geometrical figure that is defined by a series of discrete structures.

The ninth wire layer M19 may be at a same level as the fourth wire layer M14. The ninth wire layer M19 may be spaced apart from the fourth wire layer M14. The fourth wire layer M14 may be between the ninth wire layer M19 and the chip region I.

Although it is illustrated in FIG. 4 to FIG. 6 that nine wire layers M11 to M19 are within the guard-ring region II, a number of wire layers disposed within the guard-ring region II is not limited.

First to third contacts C11 to C13 may be on the substrate 100 of the guard-ring region II.

The first to third contacts C11 to C13 each may include, for example, at least one of semiconductor material doped with impurity, conductive silicide compound, conductive metal nitride, or metal.

The first contact C11 may be between the first gate electrode 121 and the fifth wire layer M15 to electrically connect the first gate electrode 121 to the fifth wire layer M15. The second contact C12 may be between the second doping layer 124 and the first wire layer M11 to electrically connect the second doping layer 124 to the first wire layer M11. The third contact C13 may be between the substrate 100 and the sixth wire layer M16 to electrically connect the substrate 100 to the sixth wire layer M16.

According to some other embodiments, positions and the number of contacts in the guard-ring region II may be different from the above.

First to third vias V11 to V15 may be on the substrate 100 of the guard-ring region II.

The first to third vias V11 to V15 may each include, for example, at least one of semiconductor material doped with impurity, conductive silicide compound, conductive metal nitride, or metal.

The first via V11 may be between the fifth wire layer M15 and the second wire layer M12 to electrically connect the fifth wire layer M15 to the second wire layer M12. The second via V12 may be between the third wire layer M13 and the fourth wire layer M14 to electrically connect the third wire layer M13 to the fourth wire layer M14. The third via V13 may be between the sixth wire layer M16 and the seventh wire layer M17 to electrically connect the sixth wire layer M16 to the seventh wire layer M17. The fourth via V14 may be between the seventh wire layer M17 and the eighth wire layer M18 to electrically connect the seventh wire layer M17 to the eighth wire layer M18. The fifth via V15 may be between the eighth wire layer M18 and the ninth wire layer M19 to electrically connect the eighth wire layer M18 to the ninth wire layer M19.

According to some other example embodiments, positions and the number of vias disposed on the guard-ring region II may be different from the above.

The interlayer insulating film 130 may be on the substrate 100 so as to wrap an upper surface of the isolation layer 110, an upper surface of the exposed second doping layer 124, the first to ninth wire layers M11 to M19, the first to third contacts C11 to C13, and the first to fifth vias V11 to V15.

The interlayer insulating film 130 may include, for example, one of silicon oxide film, silicon nitride film, silicon oxynitride film, or a combination thereof, but the present disclosure is not limited hereto.

The semiconductor device according to some example embodiments may efficiently protect the semiconductor chip from physical damage, electro-magnetic interference (EMI), electro static discharge (ESD) and so on by using the first capacitor 120 including the first doping layer 123 and the second doping layer 124 that have a same conductivity type and different doping concentrations from each other in the guard-ring region II, and a structure including a plurality of wire layers M11 to M19.

Hereinbelow, a semiconductor device according to some other example embodiments will be described with reference to FIG. 7 to FIG. 9. The difference from the semiconductor device illustrated in FIG. 4 to FIG. 6 will be highlighted.

Figure 7:
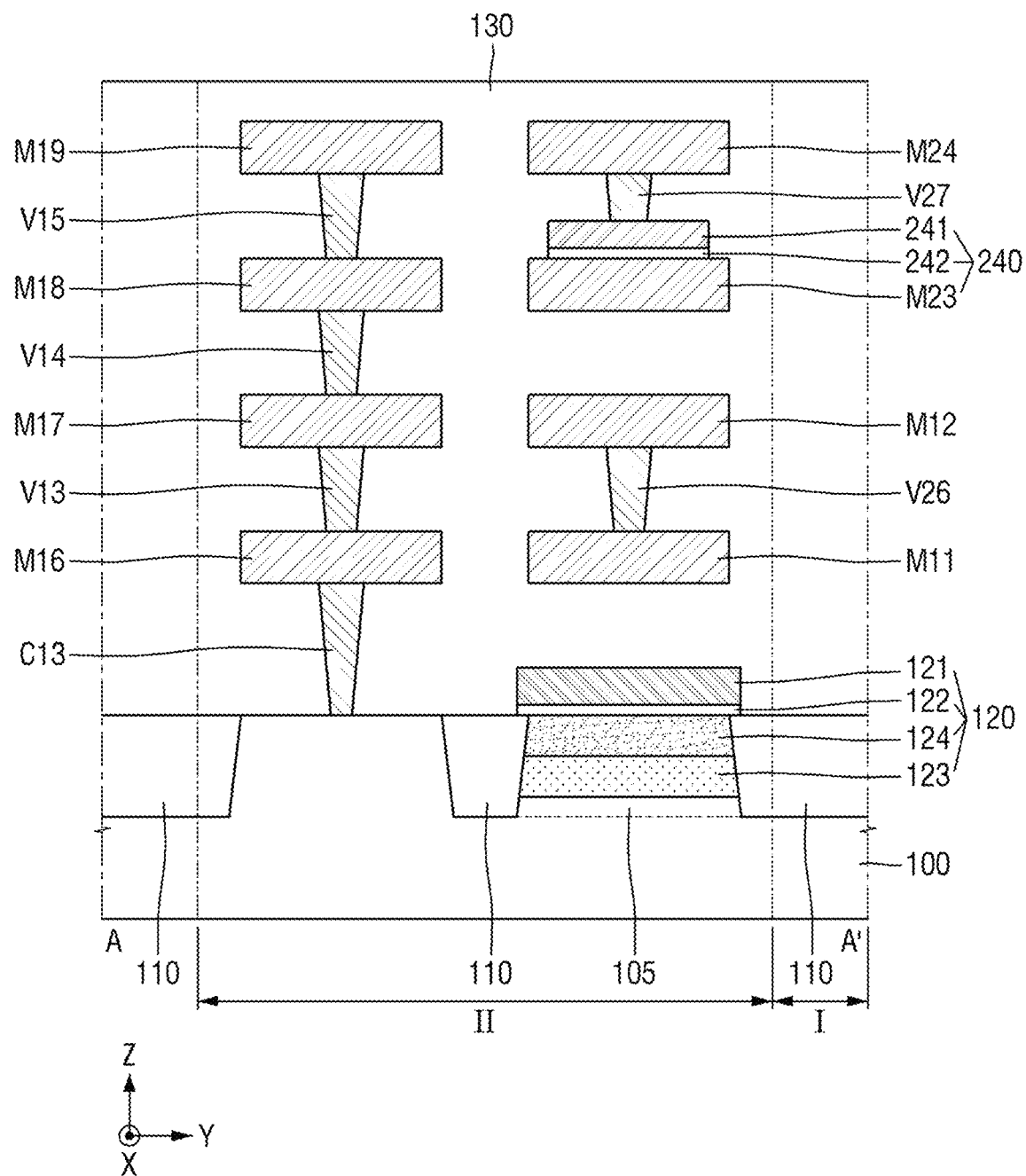
FIG. 7 to FIG. 9 are cross-sectional views provided to explain a semiconductor device according to some other example embodiments.
Figure 8:
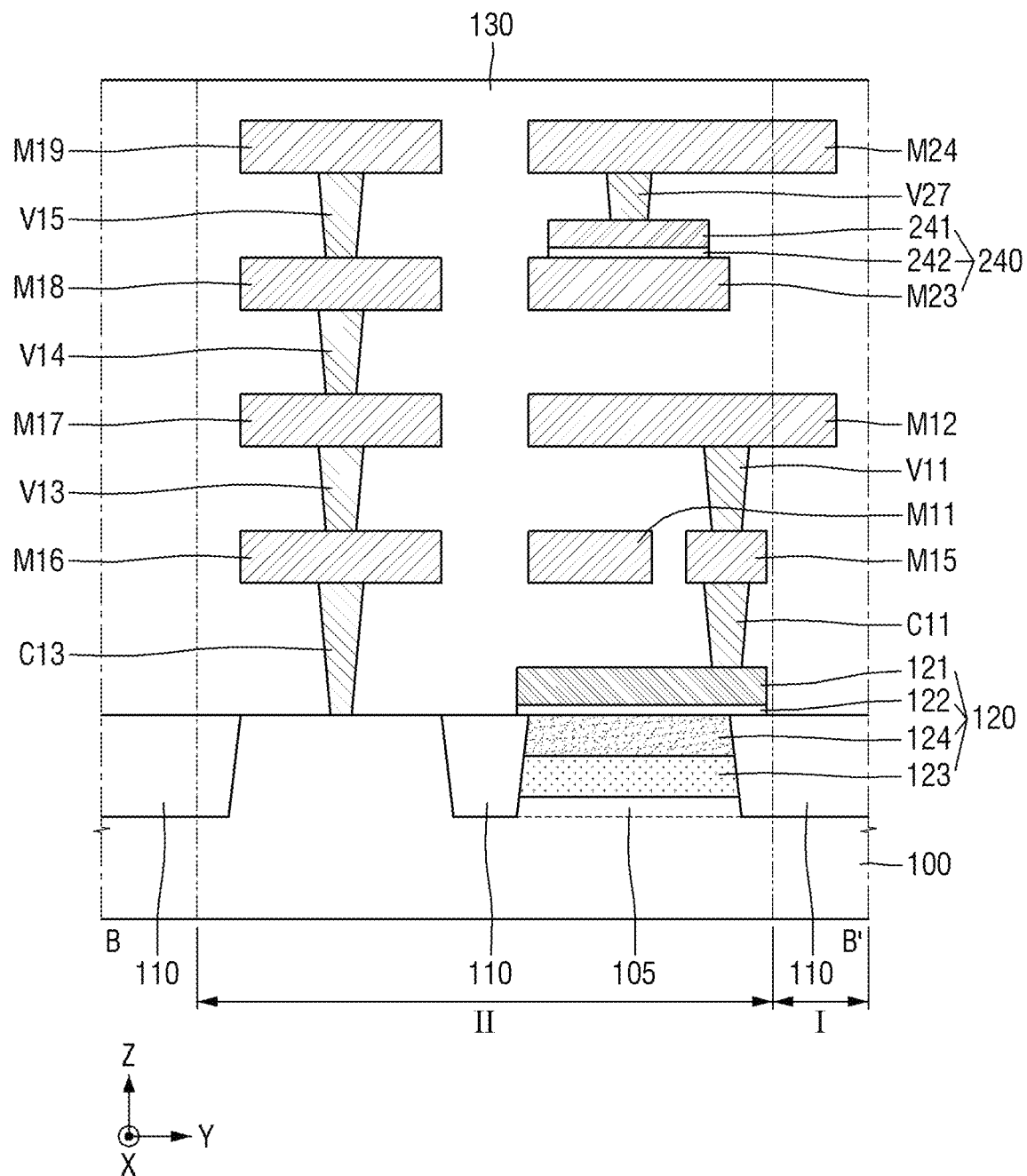
Figure 9:
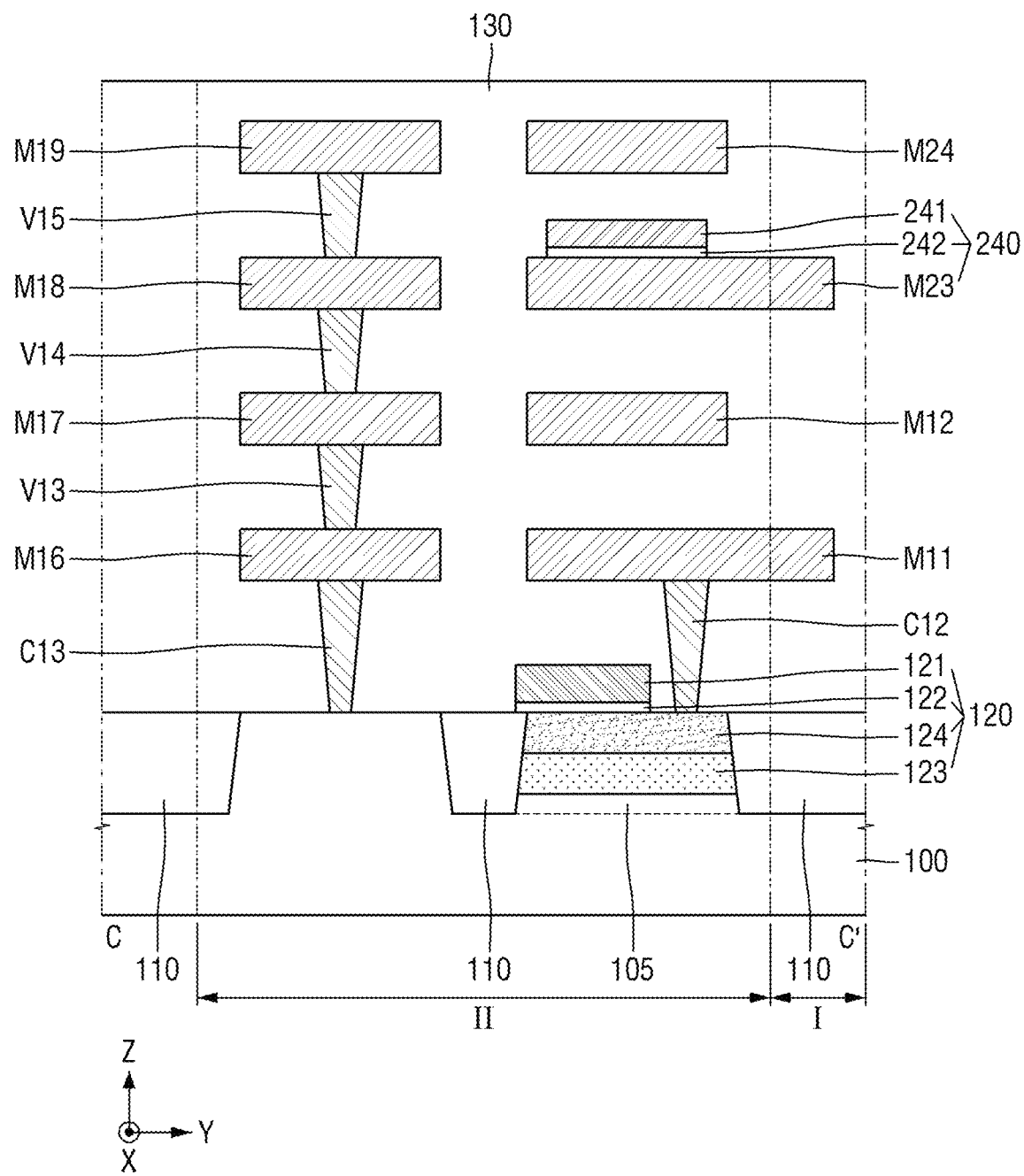

FIG. 7 to FIG. 9 are cross-sectional views provided to explain a semiconductor device according to some other example embodiments.

Referring to FIG. 7 to FIG. 9, in the semiconductor device according to some other example embodiments, a second capacitor 240 may be on the first capacitor 120 within the guard-ring region II.

The second capacitor 240 may be, for example, a metal insulator metal (MIM) capacitor. The second capacitor 240 may include a third wire layer M23, a second gate electrode 241 and a second gate insulating film 242.

The second gate insulating film 242 may be disposed conformally on the third wire layer M23 within the guard-ring region II. The second gate insulating film 242 may include silicon oxide, silicon nitride, silicon oxynitride or a high-k dielectric material with a higher dielectric constant than silicon oxide, but the present disclosure is not limited hereto.

The second gate electrode 241 may be on the second gate insulating film 242 within the guard-ring region II. The second gate electrode 241 may surround a side surface of the chip region I within the guard-ring region II. For example, the second gate electrode 241 may completely or partially surround a side surface of the chip region I as extending in the first direction X and the second direction Y. The second gate electrode 241 may have a unified or integral shape. However, the present disclosure is not limited hereto. According to some example embodiments, the unified or integral shape of the second gate electrode 241 may be a circle or a polygon. According to some example embodiments, the unified or integral shape of the second gate electrode 241 may be a geometrical figure that is not fully closed. According to some other example embodiments, the second gate electrode 241 may be a geometrical figure that is defined by a series of discrete structures.

The second gate electrode 241 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or a combination thereof.

As illustrated in FIG. 8, a portion of a fourth wire layer M24 may extend over an isolation layer 110 at a boundary between the guard-ring region II and the chip region I in a direction from the guard-ring region II to the chip region I. However, the present disclosure is not limited hereto.

As illustrated in FIG. 9, a portion of the third wire layer M23 may extend over an isolation layer 110 at a boundary between the guard-ring region II and the chip region I in of the direction from the guard-ring region II to the chip region I. However, the present disclosure is not limited hereto.

A sixth via V26 may be between the first wire layer M11 and the second wire layer M12 to electrically connect the first wire layer M11 to the second wire layer M12. A seventh via V27 may be between the second gate electrode 241 and the fourth wire layer M24 to electrically connect the second gate electrode 241 to the fourth wire layer M24.

Hereinbelow, a semiconductor device according to an example embodiment will be described with reference to FIG. 10. The difference from the semiconductor device illustrated in FIG. 4 will be highlighted.

Figure 10:
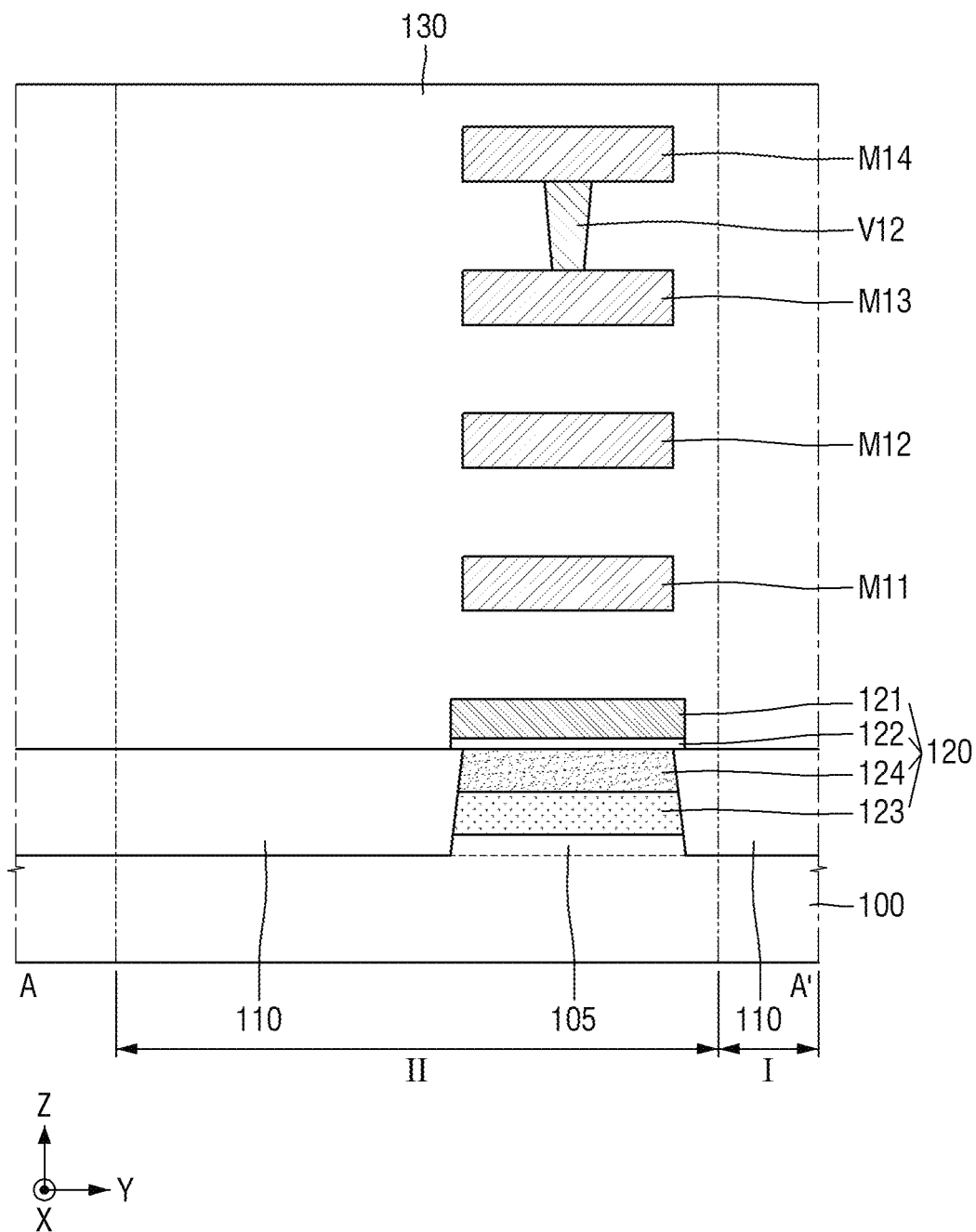
FIG. 10 is a cross-sectional view provided to explain a semiconductor device according to an example embodiment.

FIG. 10 is a cross-sectional view provided to explain a semiconductor device according to some other example embodiments.

Referring to FIG. 10, the sixth to ninth wire layers M16 to M19 of FIG. 4, the third to fifth vias V13 to V15 of FIG. 4 and the third contact C13 of FIG. 4 are not disposed in the guard-ring region II.

Hereinbelow, a semiconductor device according to an example embodiment will be described with reference to FIG. 11. The difference from the semiconductor device illustrated in FIG. 7 will be highlighted.

Figure 11:
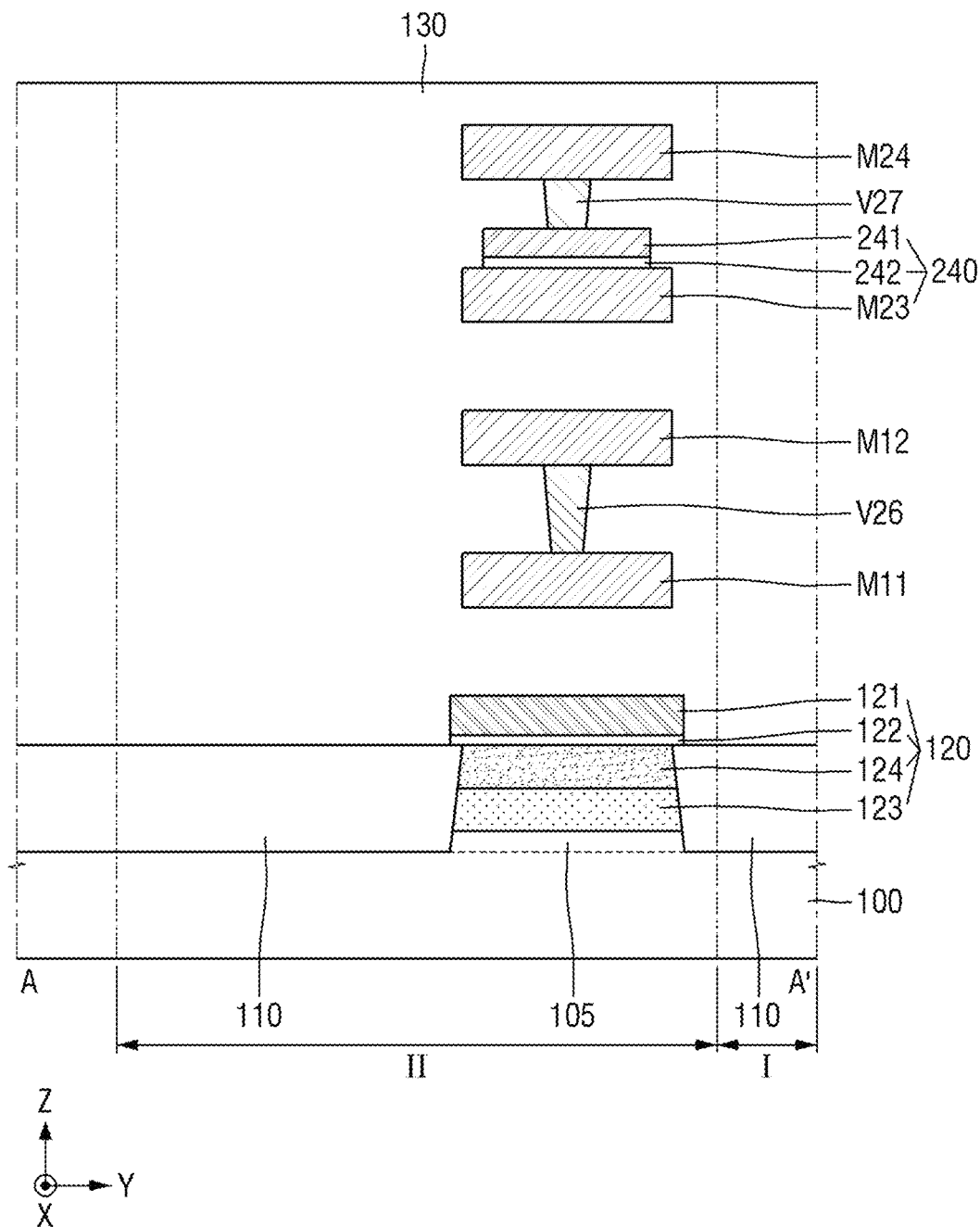
FIG. 11 is a cross-sectional view provided to explain a semiconductor device according to an example embodiment.

FIG. 11 is a cross-sectional view provided to explain a semiconductor device according to an example embodiment.

Referring to FIG. 11, the sixth to ninth wire layers M16 to M19 of FIG. 7, the third to fifth vias V13 to V15 of FIG. 7, and the third contact C13 of FIG. 7 are not disposed in the guard-ring region II.

Hereinbelow, a semiconductor device according to an example embodiment will be described with reference to FIG. 12. The difference from the semiconductor device illustrated in FIG. 4 will be highlighted.

Figure 12:
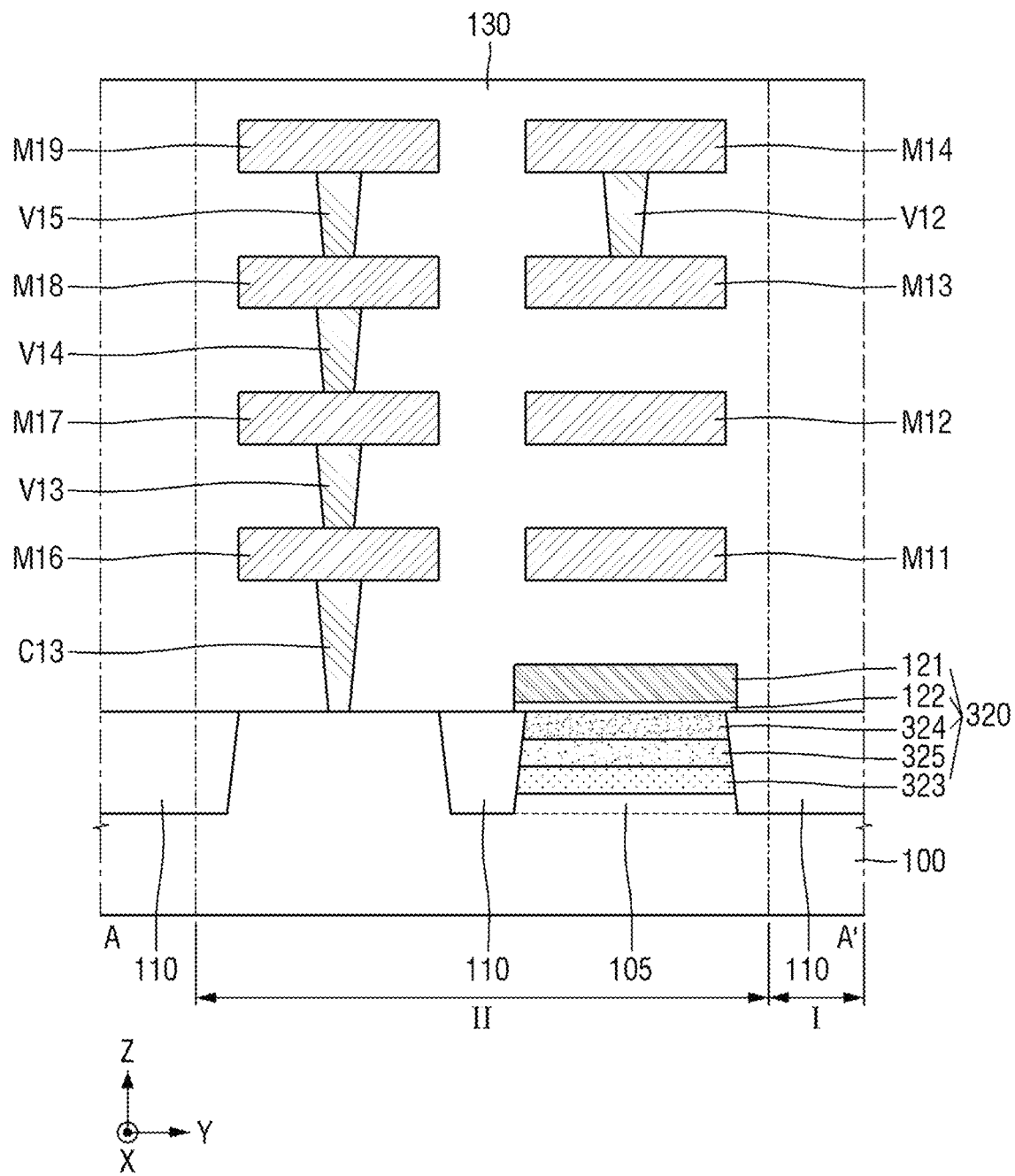
FIG. 12 is a cross-sectional view provided to explain a semiconductor device according to an example embodiment.

FIG. 12 is a cross-sectional view provided to explain a semiconductor device according to an example embodiments.

Referring to FIG. 12, a first capacitor 320 may include the first gate electrode 121, the first gate insulating film 122, a first doping layer 323, a second doping layer 324 and a doping layer 325.

The first doping layer 323 may be within the active region 105 of the guard-ring region II. The first doping layer 323 may be doped with first impurities that have a first doping concentration and are of a first conductivity type (e.g., n-type impurity).

The second doping layer 324 may be on the first doping layer 323 within the active region 105 of the guard-ring region II. The second doping layer 324 may be doped with second impurities having a second doping concentration, which is greater than a first doping concentration. The second impurities of the second doping layer 324 may have a same conductivity type (e.g., n-type impurity) as the first impurities of the first doping layer 323.

The third doping layer 325 may be between the first doping layer 323 and the second doping layer 324 within the active region 105 of the guard-ring region II. The third doping layer 325 may be doped with third impurities having a third doping concentration, which is greater than the first doping concentration and less than the second doping concentration. The third impurities of the third doping layer 325 may have a same conductivity type (e.g., n-type impurity) as the first impurities of the first doping layer 323.

A side surface of the third doping layer 325 may be in contact with the isolation layer 110.

Hereinbelow, a semiconductor device according to an example embodiment will be described with reference to FIG. 13. The difference from the semiconductor device illustrated in FIG. 1 will be highlighted.

Figure 13:
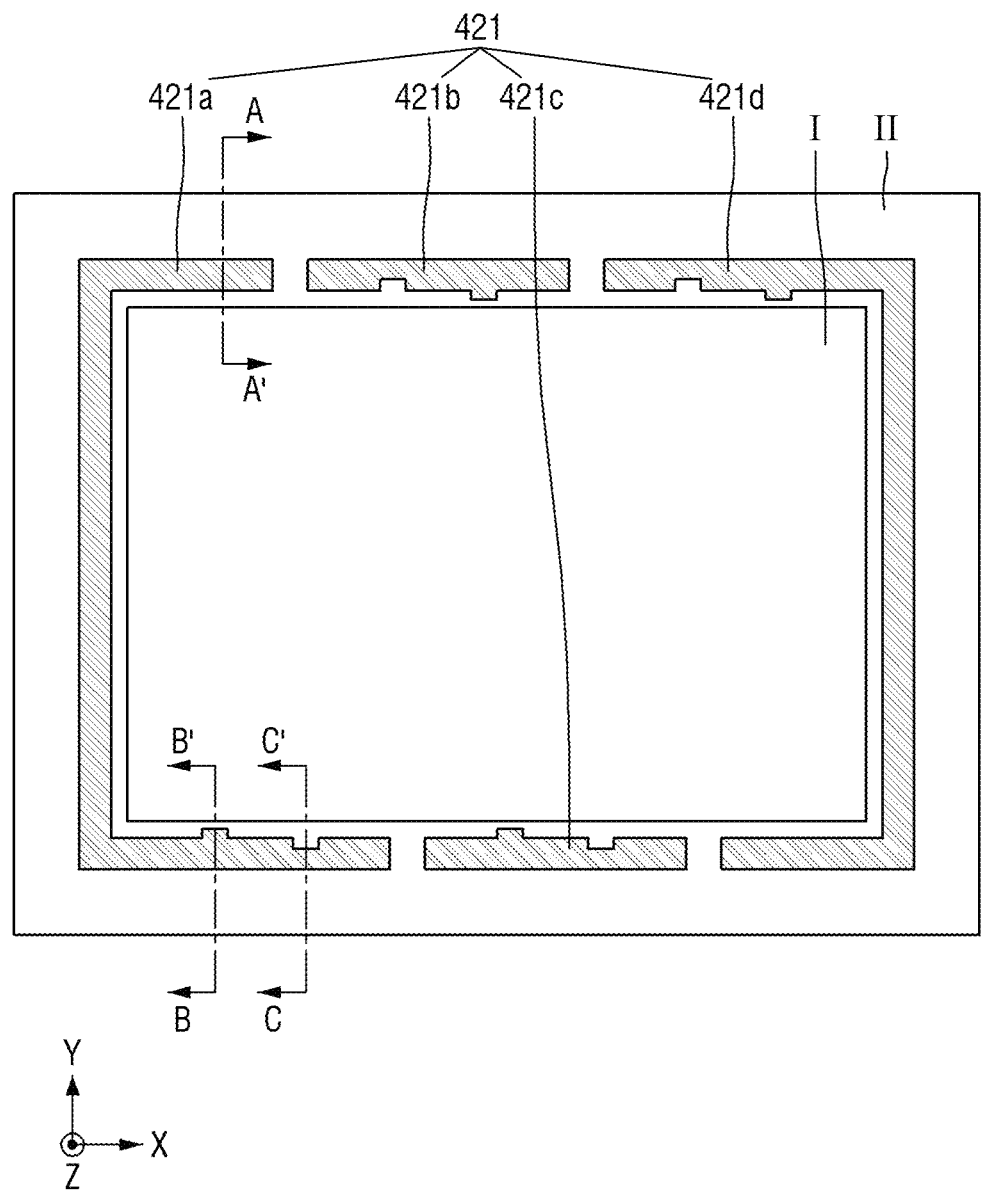
FIG. 13 is a schematic layout view provided to explain a semiconductor device according to an example embodiment.

FIG. 13 is a schematic layout view provided to explain a semiconductor device according to an example embodiment.

Referring to FIG. 13, the first capacitor may include a plurality of capacitors.

For example, the first gate electrode 421 may include a first sub gate electrode 421a, a second sub gate electrode 421b, a third sub gate electrode 421c, and a fourth sub gate electrode 421d which are spaced apart from each other.

The first to fourth sub gate electrodes 421a, 421b, 421c, and 421d may respectively form different capacitors from each other. The first to fourth sub gate electrodes 421a, 421b, 421c, and 421d may be respectively disposed at a same level.

Example embodiments according to the present disclosure were explained hereinabove with reference to the drawings attached, but it should be understood that the present disclosure is not limited to the aforementioned example embodiments, but may be fabricated in various different forms, and may be implemented by a person skilled in the art in other specific forms without altering the technical concepts or essential characteristics of the present disclosure. Accordingly, it will be understood that the example embodiments described above are only illustrative, and should not be construed as limiting.

What is claimed is:

1. A semiconductor device, comprising:
   a substrate comprising a chip region and a guard-ring region, the guard-ring region surrounding a side surface of the chip region;
   an isolation layer configured to define an active region within the guard-ring region;
   a first doping layer in the active region and doped with first impurities having a first doping concentration;
   a second doping layer on the first doping layer and in the active region, the second doping layer doped with second impurities having a same conductivity type as the first impurities of the first doping layer, the second impurities having a second doping concentration, the second doping concentration being greater than the first doping concentration;
   a first gate electrode on the second doping layer; and
   a first wire layer on the first gate electrode.

2. The semiconductor device of claim 1, further comprising:
   a second wire layer on the first wire layer; and
   a second gate electrode on the second wire layer.

3. The semiconductor device of claim 1, further comprising:
   a third wire layer on the guard-ring region at a same level as the first wire layer, and spaced apart from the first wire layer.

4. The semiconductor device of claim 3, wherein the first wire layer is between the third wire layer and the chip region.

5. The semiconductor device of claim 1, wherein the first gate electrode has a first unified shape surrounding the side surface of the chip region.

6. The semiconductor device of claim 1, wherein
   the first gate electrode comprises a first sub gate electrode and a second sub gate electrode, the first sub gate electrode and the second sub gate electrode being at a same level and spaced apart from each other.

7. The semiconductor device of claim 1, wherein the first wire layer has a second unified shape surrounding the side surface of the chip region.

8. The semiconductor device of claim 1, wherein the second doping layer is in contact with the isolation layer.

9. The semiconductor device of claim 1, further comprising:
   a third doping layer between the first doping layer and the second doping layer in the active region, the third doping layer doped with third impurities having a same conductivity type as the first doping layer, the third impurities having a third doping concentration, the third doping concentration being greater than the first doping concentration and being less than the second doping concentration.

10. The semiconductor device of claim 9, wherein the third doping layer is in contact with the isolation layer.

11. The semiconductor device of claim 1, wherein at least a portion of the first wire layer extends in the chip region.

12. A semiconductor device, comprising:
   a substrate comprising a chip region and a guard-ring region, the guard-ring region surrounding a side surface of the chip region;
   a first doping layer within the guard-ring region and doped with first impurities having a first doping concentration;
   a second doping layer on the first doping layer and within the guard-ring region, the second doping layer doped with second impurities having a same conductivity type as the first impurities of the first doping layer, the second impurities having a second doping concentration, the second doping concentration being greater than the first doping concentration;
   a first gate electrode on the second doping layer;
   a first wire layer on the first gate electrode; and
   a second wire layer on the guard-ring region at a same level as the first wire layer, and spaced apart from the first wire layer.

13. The semiconductor device of claim 12, further comprising:
   a second gate electrode on the first wire layer.

14. The semiconductor device of claim 13, wherein the second gate electrode has a unified shape surrounding the side surface of the chip region.

15. The semiconductor device of claim 12, further comprising:

an isolation layer configured to define an active region within the guard-ring region, wherein the first doping layer and the second doping layer are in the active region.

16. The semiconductor device of claim 15, wherein the second doping layer is in contact with the isolation layer.

17. A semiconductor device, comprising:

a substrate comprising a chip region and a guard-ring region, the guard-ring region surrounding a side surface of the chip region;

an isolation layer configured to define an active region within the guard-ring region;

a first doping layer in the active region, and doped with first impurities having a first doping concentration;

a second doping layer on the first doping layer and in the active region, the second doping layer being in contact with the isolation layer, the second doping layer doped with second impurities having a same conductivity type as the first impurities of the first doping layer, the second impurities having a second doping concentration, the second doping concentration being greater than the first doping concentration; and a first gate electrode on the second doping layer, the first gate electrode having a first unified shape surrounding the side surface of the chip region.

18. The semiconductor device of claim 17, further comprising:

a first wire layer on the first gate electrode, the first wire layer having a second unified shape surrounding the side surface of the chip region.

19. The semiconductor device of claim 17, further comprising:

a third doping layer between the first doping layer and the second doping layer in the active region, the third doping layer doped with third impurities having a same conductivity type as the first doping layer, the third impurities having a third doping concentration, the third doping concentration being greater than the first doping concentration and being less than the second doping concentration.

20. The semiconductor device of claim 19, wherein the third doping layer is in contact with the isolation layer.

* * * * *